(12) United States Patent
Bidner et al.

(10) Patent No.: US 8,341,950 B2
(45) Date of Patent: Jan. 1, 2013

(54) ENGINE EXHAUST SYSTEM HAVING A THERMOELECTRIC CONVERSION DEVICE AND A HEAT PIPE

(75) Inventors: David Karl Bidner, Livonia, MI (US); Robert Jay Natkin, Canton, MI (US); Shane Elwart, Ypsilanti, MI (US); Gopichandra Surnilla, West Bloomfield, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 763 days.

(21) Appl. No.: 12/175,886

(22) Filed: Jul. 18, 2008

(65) Prior Publication Data
US 2010/0011753 A1 Jan. 21, 2010

(51) Int. Cl.
*F01N 3/02* (2006.01)
*F01N 5/02* (2006.01)
*H01L 35/30* (2006.01)

(52) U.S. Cl. ............ 60/320; 60/286; 136/201; 136/202; 136/203; 136/204; 136/205; 136/209; 136/210; 136/218

(58) Field of Classification Search .............. 60/320, 60/286; 136/201–205, 209, 210, 218
See application file for complete search history.

(56) References Cited

U.S. PATENT DOCUMENTS

| | | | | |
|---|---|---|---|---|
| 3,054,840 A * | 9/1962 | Alsing | ............ | 136/204 |
| 3,238,395 A * | 3/1966 | Sense | ............ | 310/306 |
| 3,807,493 A * | 4/1974 | Stewart | ............ | 165/104.14 |
| 4,014,713 A * | 3/1977 | Markman et al. | ............ | 136/210 |
| 4,125,122 A * | 11/1978 | Stachurski | ............ | 136/205 |
| 4,470,476 A * | 9/1984 | Hunt | ............ | 180/65.25 |
| 4,516,628 A | 5/1985 | Ward | | |
| 4,727,240 A | 2/1988 | Provolo et al. | | |
| 4,971,570 A | 11/1990 | Tolle et al. | | |
| 5,218,517 A | 6/1993 | Sewell | | |
| 5,450,869 A * | 9/1995 | Brittain et al. | ............ | 136/203 |
| 6,318,077 B1 * | 11/2001 | Claypole et al. | ............ | 60/303 |
| 6,351,952 B1 | 3/2002 | Baker, III | | |
| 6,622,515 B2 | 9/2003 | Baker, III | | |
| 7,051,522 B2 | 5/2006 | Yang et al. | | |
| 7,100,369 B2 * | 9/2006 | Yamaguchi et al. | ............ | 60/324 |
| 7,128,081 B2 | 10/2006 | Dourdeville | | |
| 7,178,332 B2 * | 2/2007 | Sasaki | ............ | 60/320 |
| 7,246,487 B2 * | 7/2007 | Hara | ............ | 60/298 |
| 7,608,777 B2 * | 10/2009 | Bell et al. | ............ | 136/200 |
| 7,921,640 B2 * | 4/2011 | Major | ............ | 60/320 |
| 2003/0223919 A1 | 12/2003 | Kwak et al. | | |
| 2005/0204762 A1 | 9/2005 | Sasaki et al. | | |
| 2005/0268955 A1 | 12/2005 | Meyerkord et al. | | |
| 2006/0107681 A1 | 5/2006 | Uno et al. | | |
| 2006/0179820 A1 * | 8/2006 | Sullivan | ............ | 60/275 |
| 2007/0289326 A1 | 12/2007 | Nishikawa et al. | | |
| 2008/0023056 A1 * | 1/2008 | Kambe et al. | ............ | 136/201 |
| 2008/0073065 A1 * | 3/2008 | Samie et al. | ............ | 165/96 |
| 2009/0015023 A1 * | 1/2009 | Fleckner | ............ | 290/40 C |

* cited by examiner

*Primary Examiner* — Kenneth Bomberg
*Assistant Examiner* — Brandon Lee
(74) *Attorney, Agent, or Firm* — Julia Voutyras; Alleman Hall McCoy Russell & Tuttle LLP

(57) ABSTRACT

Systems and methods for converting engine heat energy to electricity using a thermoelectric conversion device are provided herein. One example system may include an engine heat source, a thermoelectric conversion device for converting heat into electricity, and a heat pipe. The heat pipe is positioned so that when the temperature of the engine exhaust is too high, the excess heat may be transferred away from the thermoelectric conversion device to the heat sink via the heat pipe.

20 Claims, 6 Drawing Sheets

ENGINE EXHAUST SYSTEM HAVING A THERMOELECTRIC CONVERSION DEVICE AND A HEAT PIPE

BACKGROUND AND SUMMARY

Thermoelectric conversion devices are used to convert engine waste heat, such as engine exhaust heat, into electricity.

One example system using such a device is provided by U.S. Pat. No. 7,178,332 to Sasaki. In this system, heat from the engine exhaust is harvested by a heat recovery portion coupled to an engine exhaust passage. The harvested heat is then transferred to a thermoelectric conversion device via a first heat pipe and to a downstream catalyst to warm up the catalyst via a second heat pipe. The heat pipes are designed in such ways that the engine exhaust heat is transferred to the thermoelectric conversion device only after the catalyst has been warmed up to its activation temperature.

However, the inventors herein have recognized that under certain conditions, the temperature of the heat sources may become too high, exceeding conversion capacity of the thermoelectric conversion devices and/or causing damages to the thermoelectric conversion devices. Specifically, if the temperature of the engine exhaust becomes too high, the excess heat may damage the thermoelectric conversion device.

To at least partially address the above mentioned issues, systems and methods for converting engine heat energy to electricity using a thermoelectric conversion device are provided herein. One example system may include an engine heat source, a thermoelectric conversion device for converting heat into electricity, and a heat pipe having a first end and a second end and configured to transfer heat received at the first end to the second end, the first end interposed between the engine exhaust passage and the thermoelectric conversion device, the second end disposed in a heat sink.

One example method may include passing exhaust gas through a passage in an engine exhaust passage, transferring thermal energy from the exhaust gas to a thermoelectric conversion device for converting thermal energy into electricity, and transferring thermal energy from the exhaust gas and away from the thermoelectric conversion device via a heat pipe to a heat sink when temperature at a first end of the heat pipe coupled to the exhaust passage is greater than a threshold temperature.

In this way, when the temperature of the engine exhaust is too high, for example, the excess heat may be transferred away from the thermoelectric conversion device to the heat sink via the heat pipe, thus reducing potential heat damage to the thermoelectric conversion device.

In some examples, a second thermoelectric conversion device or a heating system for heating one or more components of the vehicle is provided as the heat sink for the first heat pipe, allowing the engine waste heat to be more efficiently used. In addition, a second heat pipe may be provided to transfer excess heat away from the second thermoelectric conversion device or the heating system to reduce overheating of the second thermoelectric conversion device or the heating system.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

FIGS. 1 to 4 are schematic diagrams illustrating various embodiments of a thermoelectric conversion system 10 for converting engine waste heat, in these examples converting engine exhaust heat, into electricity. For purpose of simplicity, analogous parts in the figures are labeled identically. It should be noted, although in these embodiments, engine exhaust heat from an engine exhaust passage is used as heat source for the thermoelectric conversion system 10, in other embodiments, other engine waste heat sources may be used.

Figure 1:
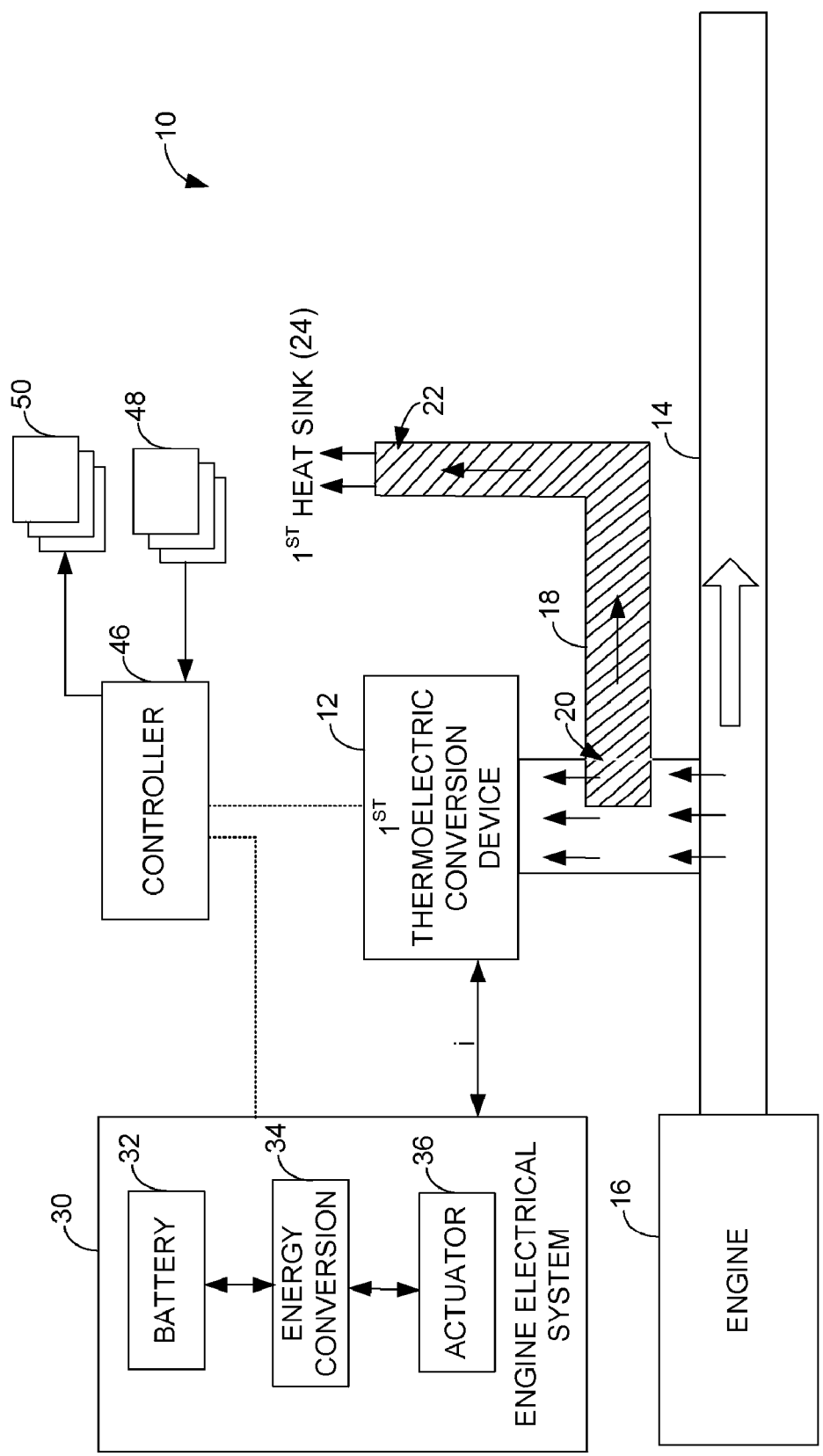
FIG. 1 is a schematic diagram illustrating an embodiment of a thermoelectric conversion system for converting engine waste heat into electricity.

Referring now to FIG. 1, the thermoelectric conversion system 10 is shown to include a first thermoelectric conversion device 12 for converting exhaust heat into electricity. The thermoelectric conversion device 12 is thermally coupled to an engine exhaust passage 14 carrying exhaust produced by the engine 16. The exhaust heat is transferred from the engine exhaust passage 14 to the thermoelectric conversion device 12 to be converted to electricity.

The thermoelectric conversion system 10 may include a first heat pipe 18. The first heat pipe 18 may include a first end 20 and a second end 22. The first end 20 may be interposed between the engine exhaust passage 14 and the thermoelectric conversion device 12. The second end 22 may be disposed in a first heat sink 24. The heat pipe 18 may be configured to transfer heat received at the first end 20 to the second end 22, for example when a temperature of the first end 20 is greater than a threshold temperature. In one particular example, the threshold temperature may be approximately 550° C.

By providing such a first heat pipe 18 that transfers heat from the first end 20 to the second end 22 when the temperature of first end is greater than a threshold temperature, it may be possible to reduce overheating of the first thermoelectric conversion device 12 when the temperature of the heat source, in this case the engine exhaust passage, is too high. It may also be possible to transfer the excess heat for use for other purposes, such as for use by a second thermoelectric conversion device or a heating system for heating one or more components a vehicle, allowing a more efficient use of the engine waste heat.

Figure 3:
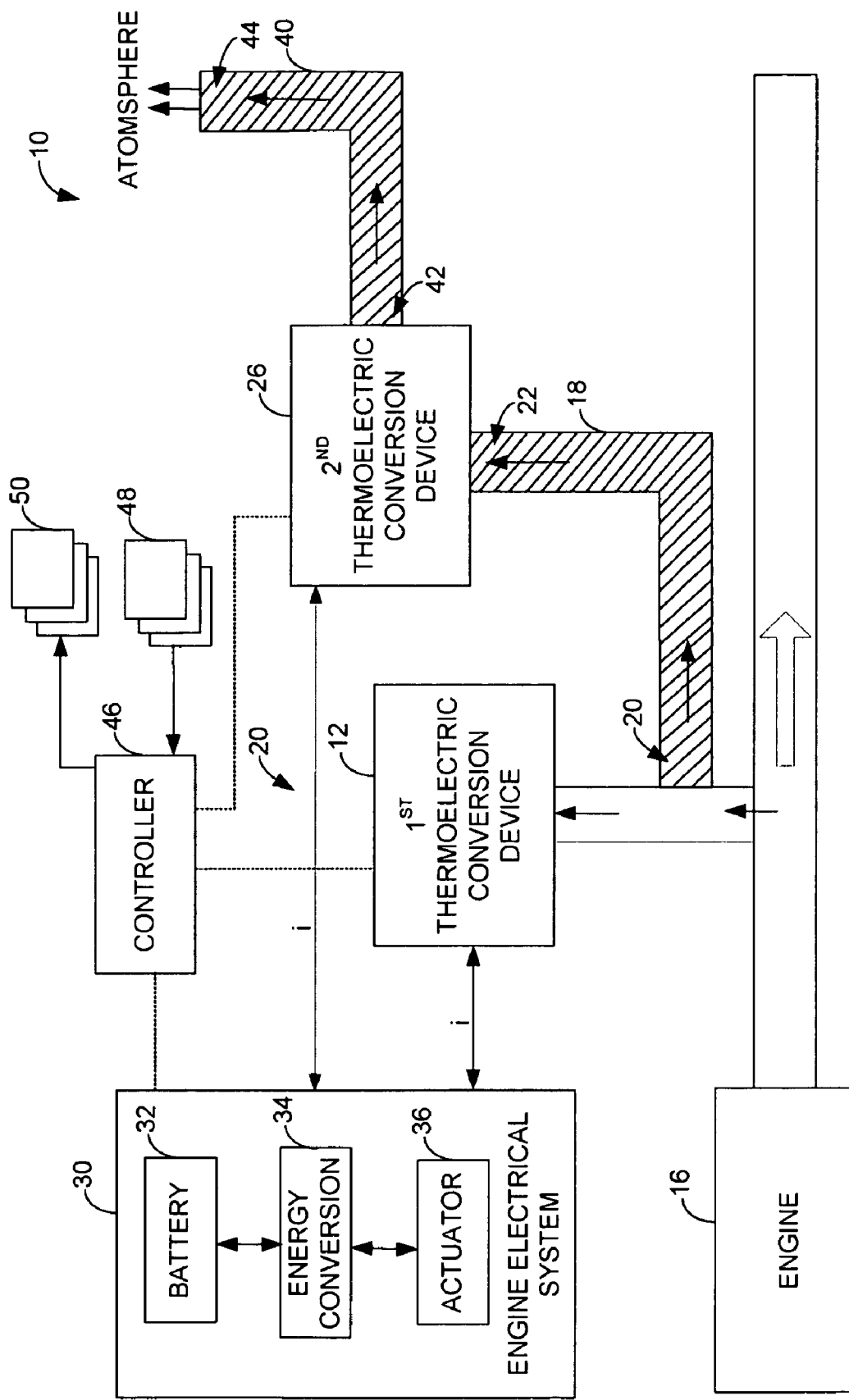
FIG. 3 is a schematic diagram illustrating yet another embodiment of a thermoelectric conversion system for converting engine waste heat into electricity.
Figure 4:
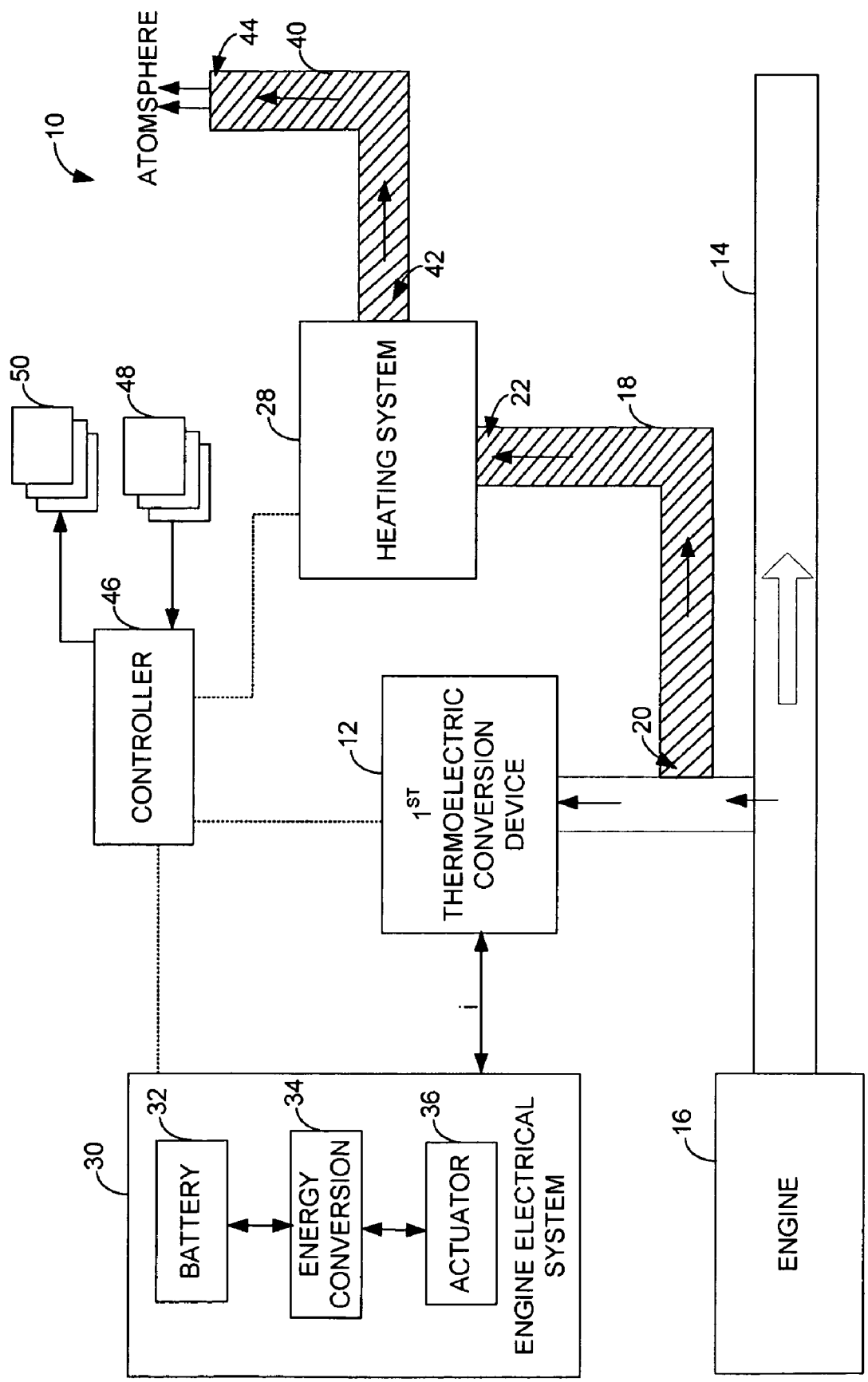
FIG. 4 is a schematic diagram illustrating still another embodiment of a thermoelectric conversion system for converting engine waste heat into electricity.

The first heat sink 24 may be an atmosphere/ambient environment as shown in FIG. 1. The first heat sink 24 may also be a second thermoelectric conversion device 26 as shown in FIG. 3, or a heating system for heating one or more components of a vehicle, such as a transmission heating system 28 for heating a transmission system of an internal combustion engine as shown in FIG. 4. Further still, it may also include a heating system for heating a passenger compartment of the vehicle, or a heating system for heating the engine of the vehicle.

The first thermoelectric conversion device 12 may be further coupled to an engine electrical system 30, which may be a part of vehicle power train system. The engine electrical system 30 may include a battery system 32, an energy conversion system 34, and various actuators 36. The electricity generated by the thermoelectric conversion system 10 may be used to charge the battery system 32 and/or power the various actuators 36.

The thermoelectric conversion system 10 may be coupled to an engine controller 46, which may be in turn coupled to various sensors 48 and actuators 50. The engine controller 46 may control the operation of one or more components of the thermoelectric conversion system 10, for example based on one or engine operating conditions. The thermoelectric conversion system 10 may also include one or more sensors for sensing operating conditions of the thermoelectric conversion system 10. It is also possible for the engine controller 46 to control various engine operations based on the one or more operating conditions of the thermoelectric conversion system 10.

Figure 2:
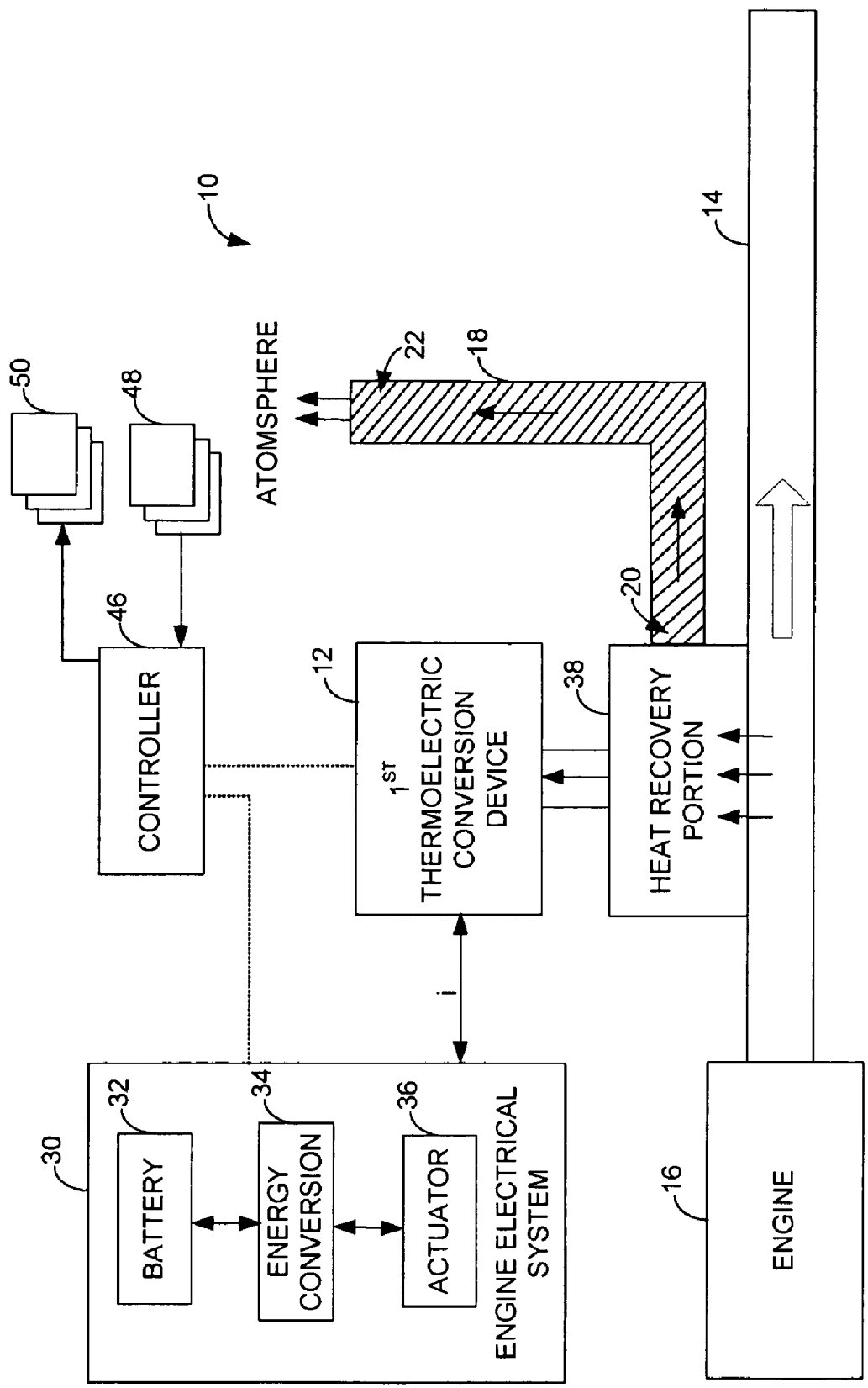
FIG. 2 is a schematic diagram illustrating another embodiment of a thermoelectric conversion system for converting engine waste heat into electricity.

Referring now to FIG. 2, the thermoelectric conversion system 10 may also include a heat recovery portion 38 for harvesting waste heat of the engine exhaust and improving heat transfer to the thermoelectric conversion device 12. Specifically, engine exhaust heat may be transferred to the thermoelectric conversion device 12 via the heat recovery portion 38. In some examples, the recovery portion 38 may include a heat exchanger and/or fins.

Referring now to FIG. 3, the thermoelectric conversion system 10 may include the second thermoelectric conversion device 26 as the first heat sink 24 of the first heat pipe 18. By providing the second thermoelectric conversion device 26, the thermoelectric conversion system 10 may be able to utilize excess heat that transferred away from the first thermoelectric conversion device 12 when the temperature of the heat source is too high.

Referring now to FIG. 4, the thermoelectric conversion system 10 may utilize a heating system 28 for heating one or more component of the vehicle may serve as the first heat sink 24 of the first heat pipe 18. Examples of the heating system 28 include transmission heating system, heating system for heating passenger compartment, and heating system for heating the engine.

Referring now to both FIGS. 3 and 4, the thermoelectric conversion system 10 may further include a second heat pipe 40 having a first end 42 and a second end 44, the first end 40 being positioned in the first heat sink 24, such as the second thermoelectric conversion device 26 in the example shown in FIG. 3 and the heating system 28 in the example shown in FIG. 4, and the second end 44 being positioned in the atmosphere/ambient environment. The second heat pipe 40 may be configured to transfer heat away from the heating system 28 when a temperature of the first end 42 is greater than a threshold temperature.

By providing the second heat pipe 40 that is configured to transfer heat away from the second thermoelectric conversion device when a temperature of the first end 42 of the second heat pipe 40 is too high, the thermoelectric conversion system 10 may provide a mechanism to protect the second thermoelectric conversion device 26 or the heating system 28 from being over heated, and/or allowing excess heat that cannot be utilized by the second thermoelectric conversion device 26 or the heating system 28 to be utilized by additional thermoelectric conversion devices.

Figure 5:
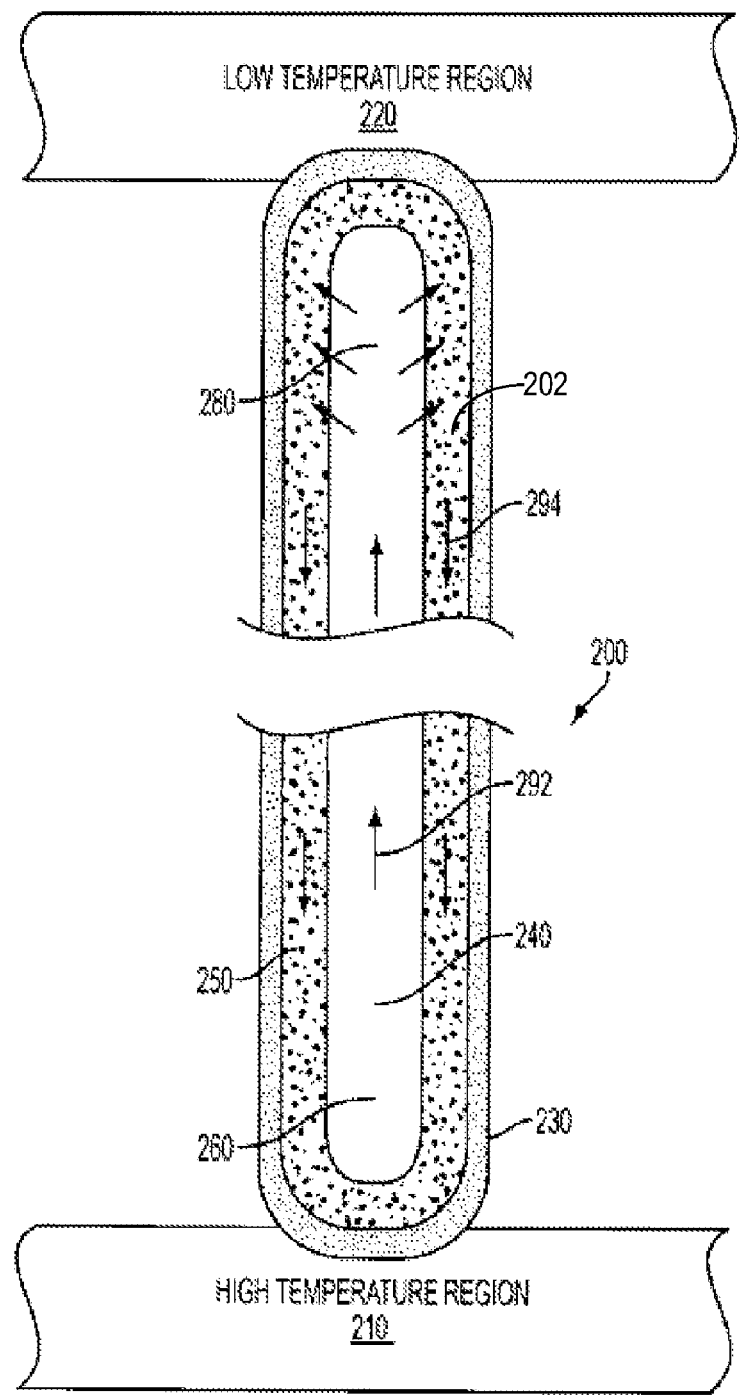
FIG. 5 is a schematic diagram illustrating an example heat pipe.

FIG. 5 is a schematic diagram illustrating an example heat pipe 200 that may be used as the heat pipe(s) of FIGS. 1-4. The elongated heat pipe 200 may include an elongated and substantially sealed casing 230 housing a working fluid 202. The heat pipe may include a first end or boiling end 260 in thermal contact with a high temperature region 210, and a second end or condenser end 280 in thermal contact with a low temperature region 210. Thermal contact or thermal coupling may include a physical coupling of the component or may include an intermediate heat exchanger, such as the heat recovery portion 38 shown in FIG. 2, for example.

In some examples, the heat pipe 200 may include a wick material 250 that facilitates the return of the condensed working fluid as indicated by vector 294 via capillary action. The wick material may include a sintered metal powder and/or a series of grooves substantially parallel to the longitudinal axis of the heat pipe 200. Alternatively, the wick material may include any suitable material or arrangement of material for promoting capillary action of the condensed working fluid 202. The capillary action promoted by the wick material can be used to enable the fluid to overcome the gravitational force, for example, where the condensed fluid must travel against the force of gravity due to the orientation of the heat pipe. However, in alternative examples, the heat pipe 200 may not necessarily include wick material.

When the high temperature region 210 is of a substantially high temperature, the working fluid 202 may be vaporized or boiled at the boiling end 260. The vaporized working fluid 202 may migrate along an inner passage 240 as indicated by vector 292, and condense at the condenser end 280. In this way, the working fluid may be cycled between the boiling end 260 and the condenser end 280. The latent heat of evaporation absorbed by the vaporization of the working fluid reduces the temperature at the boiler end of the pipe. The vapor pressure in the vicinity of the liquid working fluid at the boiler end of the heat pipe is higher than the equilibrium vapor pressure in the vicinity of the condensing working fluid at the condenser end of the pipe, and this pressure difference drives a rapid mass transfer to the condensing end where the excess vapor releases its latent heat, warming the cool end of the pipe. In this way, the heat pipe 200 may be able to transfer heat at a rate substantially higher than by conduction processes.

Operation of the heat pipe may be governed by the selection of the particular working fluid or fluids used therein. For example, where the boiler end 260 is at a temperature that 200 is lower than the boiling point of each substance of the working fluid 202, the heat pipe may transfer a relatively small amount of heat via conduction along the casing of the heat pipe. Where the higher temperature region attains or surpasses the boiling point of at least one substance of the working fluid, the heat pipe may begin transferring heat via migration of the working fluid or a substance thereof from the boiler end to the condenser end as described above, thereby substantially increasing the rate of heat transfer between the higher temperature region and the lower temperature region. Where the boiler end exceeds an upper threshold temperature, the working fluid may be completely vaporized, thereby causing the migration of the working fluid to lessen or to stagnate, which reduces the heat transfer to conduction along the casing.

The working fluid 202 of the heat pipe may contain one or more substances. As one non-limiting example, the working fluid may comprise one or more substances including water, ethanol, methanol, mercury, coolant, or other suitable fluid. By selecting an appropriate substance or mixture of substances for the working fluid, a suitable temperature window at which the heat pipe transfers heat by migration of the working fluid may be achieved. In this way, a heat pipe may be configured to transfer heat at a substantially higher rate during some conditions (e.g. between boiling temperature and stagnation temperature) and transfer heat at a substantially lower rate (e.g. via conduction) during other conditions.

Heat pipe 200 may have a shape other than the straight elongate element shown in FIG. 5. The heat pipe 200 may include a casing having a plurality of segments for transferring the working fluid via internal passage. A flexible casing may be used to couple the boiler end 260 to the condenser end 280, enabling the working fluid to flow via internal passage 240.

Figure 6:
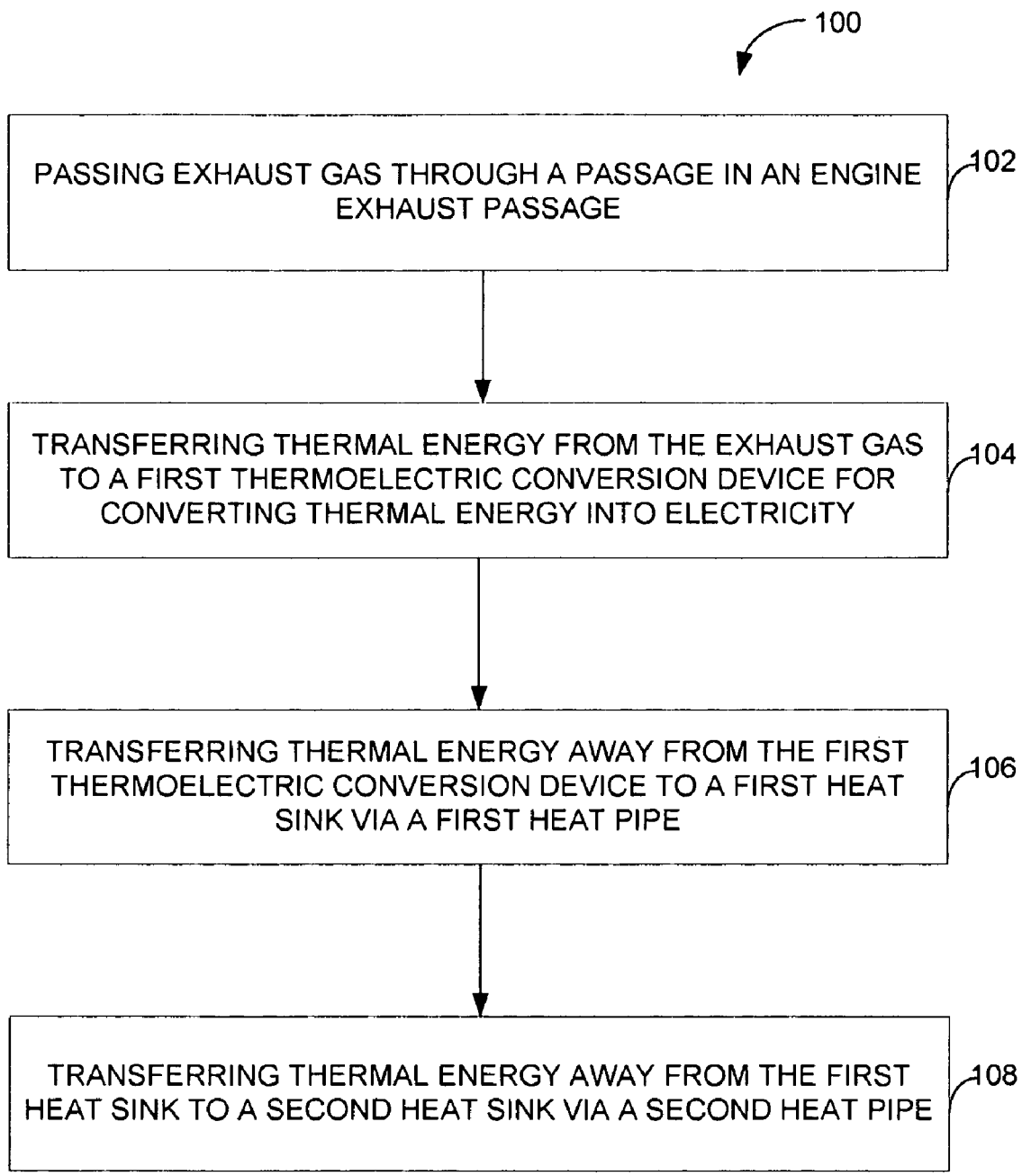
FIG. 6 is a flowchart of a method for converting engine waste heat into electricity, which may be implemented in the thermoelectric conversion systems provided herein.

FIG. 6 is a flowchart of an example method 100 for using a thermoelectric conversion device for converting engine waste heat, such as engine exhaust heat, to electricity. The method 100 may include, at 102 passing exhaust gas through a passage in an engine exhaust passage.

The method may additionally include, at 104, transferring thermal energy from the exhaust gas to a thermoelectric conversion device for converting thermal energy into electricity.

The method may further include, at 106, transferring thermal energy from the exhaust gas and away from the first thermoelectric conversion device via a first heat pipe to a first heat sink when temperature at a first end of the first heat pipe interposed between the engine exhaust passage and the first thermoelectric conversion device is greater than threshold temperature. The threshold temperature may for example be approximately 550° C.

The first heat sink may be an atmosphere/ambient environment, or a second thermoelectric conversion device, or heating system of a vehicle for heating one or more components of a vehicle, such as a heating system for heating passenger compartment of a vehicle, a heating system for heating an internal combustion engine, and/or a heating system for heating a transmission, as described above herein.

The method may further include at 108, transferring thermal energy from the first heat sink (e.g., the second thermoelectric conversion device or the heating system), via the second heat pipe to a second heat sink.

The second heat sink may be an atmosphere/ambient environment, or a second thermoelectric conversion device, or heating system of a vehicle for heating one or more components of a vehicle, such as a heating system for heating passenger compartment of a vehicle, a heating system for heating an internal combustion engine, and/or a heating system for heating a transmission.

The second heat pipe may include a first end thermally coupled to the second thermoelectric conversion device and a second end thermally coupled to the second heat sink. The second heat pipe may be configured to transfer heat away from the second heat sink (e.g., the second thermoelectric conversion device or the heating system) when a temperature at the first end of the second heat pipe is higher than a threshold temperature. In this way, the second heat sink (e.g., the second thermoelectric conversion device or the heating system) may be protected from overheating. It should also be noted that the method may further including transferring thermal energy to additional thermoelectric devices or heating systems via additional heat pipes.

It will be appreciated that the configurations and routines disclosed herein are exemplary in nature, and that these specific embodiments are not to be considered in a limiting sense, because numerous variations are possible. For example, the above technology can be applied to V-6, I-4, I-6, V-12, opposed 4, and other engine types. The subject matter of the present disclosure includes all novel and nonobvious combinations and subcombinations of the various systems and configurations, and other features, functions, and/or properties disclosed herein.

The following claims particularly point out certain combinations and subcombinations regarded as novel and nonobvious. These claims may refer to "an" element or "a first" element or the equivalent thereof. Such claims should be understood to include incorporation of one or more such elements, neither requiring nor excluding two or more such elements. Other combinations and subcombinations of the disclosed features, functions, elements, and/or properties may be claimed through amendment of the present claims or through presentation of new claims in this or a related application. Such claims, whether broader, narrower, equal, or different in scope to the original claims, also are regarded as included within the subject matter of the present disclosure.

The invention claimed is:

1. A system, comprising:
a vehicle including a V-type internal combustion engine having an exhaust passage;
a thermoelectric conversion device receiving heat from the exhaust passage of the internal combustion engine even when exhaust temperature is below a threshold;
a heat pipe transferring heat from a first end of the pipe interposed between the exhaust passage and the thermoelectric conversion device to a second end of the pipe disposed in a heat sink, via a working fluid, only when exhaust temperature exceeds the threshold.

2. The system of claim 1, wherein the thermoelectric conversion device is electrically coupled to an electrical system, and the heat sink is positioned away from the thermoelectric conversion device.

3. The system of claim 1, wherein the heat pipe is configured to transfer heat away from the thermoelectric conversion device when a temperature of the first end is greater than the threshold.

4. The system of claim 3, wherein the threshold is approximately 550° C.

5. The system of claim 1, further comprising a heat exchanger between the first end of the heat pipe and the exhaust passage.

6. The system of claim 1, wherein the heat sink is an atmosphere/ambient environment.

7. The system of claim 1, wherein the heat sink is a second thermoelectric conversion device.

8. The system of claim 1, wherein the heat sink is a heating system for heating one or more components of the vehicle.

9. The system of claim 8, wherein the heat sink is a passenger compartment heating system for heating a passenger compartment.

10. The system of claim 8, wherein the heat sink is an engine heating system for heating the engine.

11. The system of claim 8, wherein the heat sink is a transmission heating system for heating a transmission system of the engine.

12. A system, comprising:
a vehicle having a powertrain with an I-type internal combustion engine;
an exhaust passage of the internal combustion engine;
a first thermoelectric conversion device for converting heat into electricity;
a second thermoelectric conversion device for converting heat into electricity;
a heat sink;
a powertrain component;
a first heat pipe having a first end and a second end and configured to transfer heat received at the first end to the second end, the first end interposed between the exhaust passage and the first thermoelectric conversion device, the second end thermally coupled to the second thermoelectric conversion device; and a second heat pipe having a first end and a second end and configured to transfer heat received at the first end to the second end, the first end coupled to the second thermoelectric conversion device, the second end thermally coupled to the heat sink.

13. The system of claim 12, wherein the powertrain component is a transmission.

14. A method, comprising:

below a threshold temperature, transferring heat from an exhaust of an internal combustion V-type engine of a powertrain of a vehicle to a thermoelectric conversion device for converting heat into electricity; and transferring heat from the exhaust to a heat sink via a heat pipe only above the threshold temperature, the heat pipe having a first end interposed between the exhaust and the thermoelectric conversion device, and a second end disposed in the heat sink positioned away from the thermoelectric conversion device.

15. The method of claim 14, wherein the threshold temperature is approximately 550° C., the method further comprising converting thermal energy into electricity in the thermoelectric conversion device and delivering the electricity to an engine electrical system including a battery to charge the battery.

16. The method of claim 14, wherein the heat sink is an atmosphere/ambient environment.

17. The method of claim 14, wherein the heat sink is a second thermoelectric conversion device.

18. The method of claim 14, wherein the heat sink is a heating system for heating one or more components of the vehicle.

19. The method of claim 14, wherein the heat sink is a passenger compartment heating system for heating a passenger compartment of the vehicle.

20. The method of claim 14, wherein the heat sink is a heating system for heating a transmission system.

* * * * *